(12) United States Patent
Moon et al.

(10) Patent No.: US 8,618,566 B2
(45) Date of Patent: Dec. 31, 2013

(54) LIGHT EMITTING DEVICE AND METHOD OF MANUFACTURING THE SAME

(75) Inventors: Yong Tae Moon, Seoul (KR); Jeong Soon Yim, Seoul (KR); Jeong Sik Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 59 days.

(21) Appl. No.: 13/023,013

(22) Filed: Feb. 8, 2011

(65) Prior Publication Data

US 2011/0198562 A1 Aug. 18, 2011

(30) Foreign Application Priority Data

Feb. 18, 2010 (KR) .................. 10-2010-0014441

(51) Int. Cl.
*H01L 33/00* (2010.01)
(52) U.S. Cl.
USPC .................. 257/98; 257/E33.067
(58) Field of Classification Search
USPC ........ 257/79, 98, E33.003, E33.067, E33.068
See application file for complete search history.

(56) References Cited

U.S. PATENT DOCUMENTS

| | | | |
|---|---|---|---|
| 5,300,788 A | 4/1994 | Fan et al. | |
| 6,504,180 B1 | 1/2003 | Heremans et al. | |
| 7,393,411 B2 | 7/2008 | Ichinose et al. | |
| 7,524,741 B2 | 4/2009 | Ushida et al. | |
| 2001/0006316 A1* | 7/2001 | Berger | 310/261 |
| 2005/0159000 A1 | 7/2005 | Ohno et al. | |
| 2006/0011925 A1* | 1/2006 | Bader et al. | 257/78 |
| 2006/0261323 A1 | 11/2006 | Suh et al. | |
| 2007/0134833 A1* | 6/2007 | Ikemoto et al. | 438/33 |
| 2007/0141813 A1* | 6/2007 | Song | 438/483 |
| 2008/0283503 A1* | 11/2008 | Liu et al. | 216/99 |

FOREIGN PATENT DOCUMENTS

| | | |
|---|---|---|
| CN | 1983555 | 6/2007 |
| KR | 10-2006-0007366 A | 1/2006 |
| KR | 10-0638819 B1 | 10/2006 |
| KR | 10-0673640 B1 | 1/2007 |
| KR | 10-2008-0008850 A | 1/2008 |
| KR | 10-2009-0111889 A | 10/2009 |
| TW | I317178 | 9/2006 |
| TW | 200705704 | 2/2007 |

OTHER PUBLICATIONS

Oshima et al., "Wet Etching of 13-Ga2O3 Substrates", Japanese Journal of Applied Physics, 48, © 2009, pp. 040208-1 - 0402083.*
Hwang et al. "Vision for Semiconductor Lighting Substrate Technology", Weekly Technology Trends, No. 1392, Apr. 15, 2009.
Oshima et al. "Wet Etching of β-$Ga_2O_3$ Substrates", Japanese journal of Applied Physics, 48, 040208, 2009.

* cited by examiner

*Primary Examiner* — Stephen W Smoot
*Assistant Examiner* — Sun M Kim
(74) *Attorney, Agent, or Firm* — McKenna Long & Aldridge LLP

(57) ABSTRACT

Provided is a light emitting device. In one embodiment, a light emitting device includes: a substrate including β-Ga2O3; a light emitting structure on the substrate, the light emitting structure including a first conductive type semiconductor layer, an active layer, and a second conductive type semiconductor layer; an electrode on the light emitting structure; and a porous layer at a lateral surface region of the substrate.

8 Claims, 8 Drawing Sheets

LIGHT EMITTING DEVICE AND METHOD OF MANUFACTURING THE SAME

CROSS-REFERENCE TO RELATED APPLICATIONS

The present application claims priority under 35 U.S.C. §119(a) of Korean Patent Application No. 10-2010-0014441 filed on Feb. 18, 2010, which is hereby incorporated by reference in its entirety.

BACKGROUND

Embodiments relate to a light emitting device and a method of manufacturing the same.

A light emitting diode (LED) is a semiconductor light emitting device converting current to light. In recent years, as the luminance of the LED increases gradually, the use of the LED as a light source for a display, a light source for a vehicle, and a light source for a lighting system is increasing. An LED emitting white light and having superior efficiency may be implemented by using a fluorescent material or combining individual LEDs that emit three primary colors.

The luminance of the LED depends on various conditions, such as the structure of an active layer, a light extracting structure capable of effectively extracting light to an outside, semiconductor material used in the LED, a chip size, and the type of a molding member enclosing the LED.

SUMMARY

Embodiments provide a light emitting device having a novel structure and a method of manufacturing the same.

Embodiments also provide a light emitting device having an enhanced reliability and a method of manufacturing the same.

Embodiments also provide a light emitting device and a method of the same having an efficiency in a manufacturing process.

In one embodiment, a light emitting device includes: a substrate including $\beta$-$Ga_2O_3$; a light emitting structure on the substrate, the light emitting structure including a first conductive type semiconductor layer, an active layer, and a second conductive type semiconductor layer; an electrode on the light emitting structure; and a porous layer at a lateral surface region of the substrate.

In another embodiment, a method of manufacturing a light emitting device includes: forming light emitting structure by sequentially stacking a first conductive type semiconductor layer, an active layer, and a second conductive type semiconductor layer on a substrate including $\beta$-$Ga_2O_3$; dividing the light emitting structure into individual light emitting device units by performing an isolation etching along a chip boundary region of the light emitting structure; forming a passivation layer to surround a lateral surface and a top surface of the light emitting structure divided into the individual light emitting device units; and dividing the substrate into the individual light emitting device units through electrochemical etching.

DETAILED DESCRIPTION OF THE EMBODIMENTS

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, word "on," or "under," are will be described based on the accompanying drawings.

In the figures, the dimensions of layers and regions are exaggerated for clarity of illustration. In addition, the dimension of each part does not reflect an actual size.

Hereinafter, a light emitting device, a method of manufacturing the same, a light emitting device package, and a lighting system according to embodiments will be described with reference to the accompanying drawings.

Figure 1:
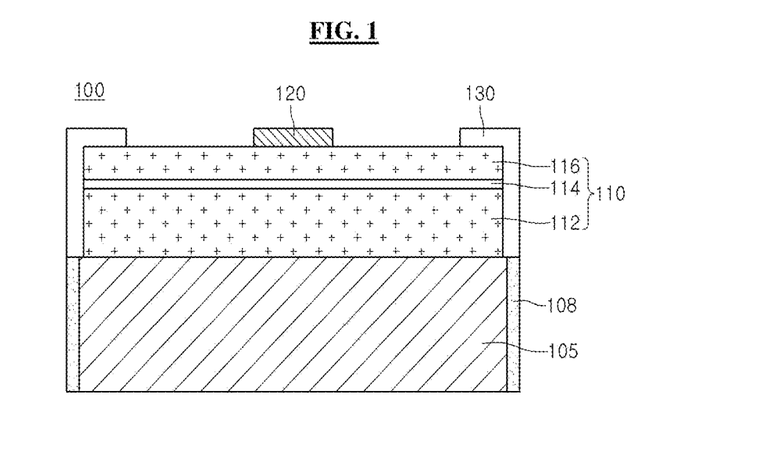
FIG. 1 is a cross-sectional view of a light emitting device according to an embodiment.

FIG. 1 is a cross-sectional view of a light emitting device 100 according to an embodiment.

Referring to FIG. 1, the light emitting device 100 according to the embodiment includes a substrate 105 including $\beta$-$Ga_2O_3$, a light emitting structure 110 including a first conductive type semiconductor layer 112, an active layer 114, and a second conductive type semiconductor layer 116 for emitting a light on the substrate 105, an electrode 120 on the light emitting structure 110, a porous layer 108 at a lateral surface region of the substrate 105, and a passivation layer 130 formed at at least the lateral surface region of the light emitting structure 110. That is, the substrate 105 includes a central region (a first region) and lateral regions (second regions) at lateral surfaces of the first region. Here, each of the lateral regions has a porosity larger than that of the central region. The second region may form the porous layer 108.

The $\beta$-$Ga_2O_3$ included in the substrate 105 may have a large band gap(Eg), about 4.8 eV (260 nm), and can have an electrical conductivity when n-type or p-type conductive dopants are doped into the $\beta$-$Ga_2O_3$. Thus, the substrate 105 including $\beta$-$Ga_2O_3$ and the electrode 120 form a vertical electrode structure, and thus supply the power to the light emitting structure 110.

Also, the substrate 105 including $\beta$-$Ga_2O_3$ has a transparency and a low light absorption in a region from a visible ray to an infrared ray. Thus, the light emitted from the light emitting structure 110 is not absorbed by the substrate 105 and is extracted to the outside through the substrate 105. Accordingly, the light efficiency of the light emitting device 100 according to the embodiment can be enhanced.

In addition, the difference between the β-Ga$_2$O$_3$ and a GaN-series conductive material in a lattice constant and a thermal expansion coefficient is small. Therefore, the light emitting structure 110 having the GaN-series conductive material can be formed with a good crystalline property on the substrate 105. Thus, the reliability of the light emitting device 100 according to the embodiment can be enhanced.

Further, when oxygen(O) is replaced with nitride(N) by nitriding of the substrate 105 including β-Ga$_2$O$_3$, the GaN-series material can be easily formed on a surface of the substrate 105. The GaN-series material may act as a buffer layer when the light emitting structure 110 including a GaN-series material is grown. By the buffer layer, the light emitting structure 110 can be stably formed on the substrate 105.

Although the substrate 105 including β-Ga2O3 has the various advantages in the above, an chip separating process that separates the substrate 105 into the individual light emitting device units may be not easy due to the crystal structure of the β-Ga$_2$O$_3$. Hereinafter, this will be described with reference to the accompanying drawings.

Figure 2:
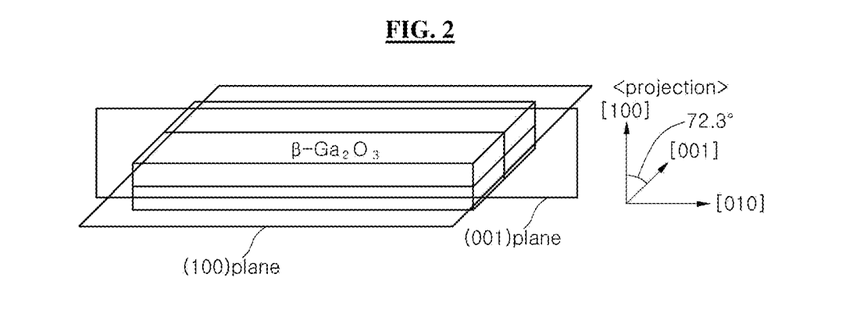
FIG. 2 illustrates two cleavage planes of a substrate including β-Ga2O3 in the light emitting device according to the embodiment.
Figure 3:
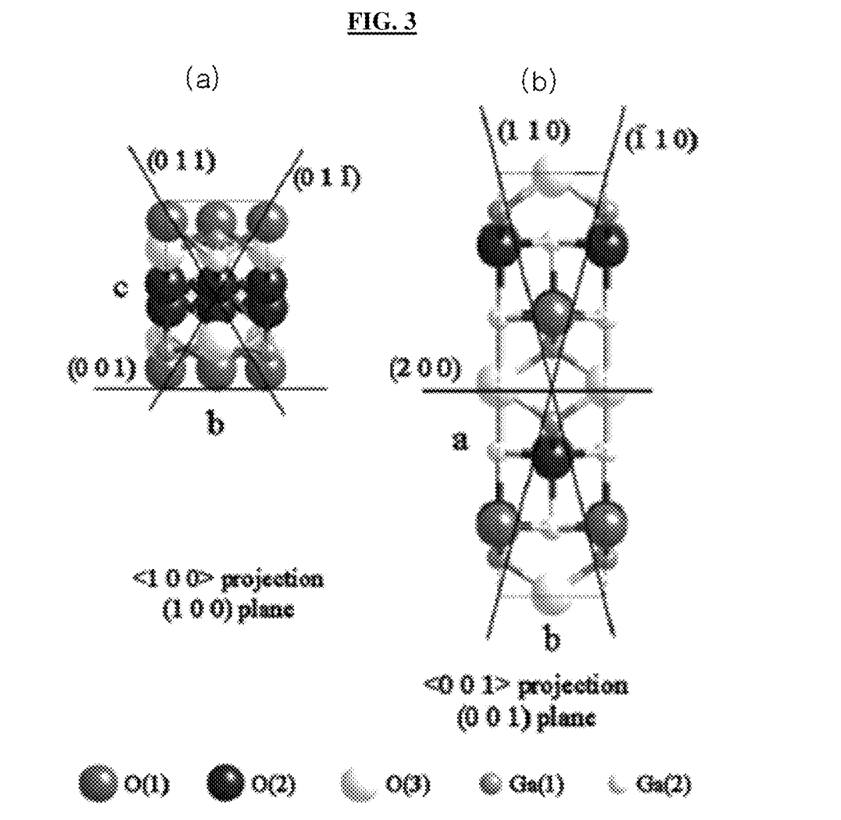
FIG. 3 illustrates a crystal structure of the cleavage plane of the substrate including β-Ga2O3 in the light emitting device according to the embodiment.

FIG. 2 illustrates two cleavage planes of the substrate 105 including the β-Ga$_2$O$_3$. (a) of FIG. 3 illustrates a crystal structure of the [100] plane of the substrate 105 including β-Ga$_2$O$_3$, and (b) of FIG. 3 illustrates a crystal structure of the [001] plane of the substrate 105 including β-Ga$_2$O$_3$. In FIG. 3, small or large spheres illustrate atoms constituting the substrate 105 including the β-Ga$_2$O$_3$.

Referring to FIG. 2, the substrate 105 including the β-Ga$_2$O$_3$ has two cleavage planes (that is, [100] plane and [001] plane). Here, the [100] plane and [001] plane have an included angle of 72.3°.

Referring to (a) of FIG. 3, since the [100] plane has a layered structure, the peeling may easily generate. Referring to (b) of FIG. 3, the [001] plane may be separated with an angle of 72.3° with the [100] plane. That is, the [001] plane is not separated perpendicular to the [100] plane.

When the light emitting structure 110 is grown on the [100] plane, it is desirable that the [001] plane is perpendicular to the [100] plane in order to easily perform the chip separating process.

However, the [100] plane and [001] plane are not perpendicular to each other, and have the included angle of 72.3°. Thus, the chip separating process may be difficult.

When a plurality of light emitting devices 100 are manufactured by using the [100]-oriendted β-Ga$_2$O$_3$ substrate 105, the light emitting structure 110 is grown at the plane of the substrate 105, and then a scribing process or a dicing process for the chip separating process is carried out to the substrate 105. At the scribing process or the dicing process, the problem may be induced.

That is, the peeling of the [100] plane may be generated by the the scribing process or the dicing process. Also, the chips are not separated even though the the scribing process or the dicing process is performed many times.

Thus, in the embodiment, at the chip separating process, an electrochemical etching is used. Accordingly, the reliability in a method of manufacturing the light emitting device 100 can be improved.

Specifically, in the chip separating etching using the electrochemical etching, a wafer(substrate) where the plurality of the light emitting devices are defined is dipped in an etching solution, and a bias voltage is applied to the etching solution. Then, the wafer (substrate) is separated to the individual light emitting device units.

Since the activation energy of the etching solution can be increased due to the bias voltage, a boundary between the plurality of the light emitting device units can be efficiently etched. If the bias voltage is not applied, at the boundary between the plurality of the light emitting device units, the etching of the β-Ga$_2$O$_3$ substrate 105 may be difficult.

The substrate 105 may have a thickness in a range of about 1 μm to about 500 μm. However, the embodiment is not limited thereto. Thus, the thickness of the substrate 105 can be determined so that the light can be efficiently penetrated or extracted there through and so that the chip separating process can be easily performed.

Meanwhile, the porous layer 108 may be formed at a lateral surface region of the β-Ga$_2$O$_3$ substrate 105 by the electrochemical etching.

In the electrochemical etching, the etching solution and the current by the bias voltage pass through the boundary between the plurality of the light emitting device units, and then the units are isolated each other. Thus, the porous layer 108 is a remainder due to the chip separating process using the electrochemical etching.

Therefore, the porous layer 108 may have a material identical to a material of the substrate 105 and may have a crystalline structure different from a crystalline structure of the substrate 105. That is, although both of the substrate 105 and the porous layer 108 include β-Ga$_2$O$_3$, the substrate 105 has a crystalline structure and the porous layer 108 has a porous structure. That is, the lateral regions of the substrate 105 may have porosity larger than that of the central regions of the substrate 105 where the porous layer 108 is formed.

In addition, the material contained in the etching solution can be detected at the lateral regions of the substrate 105. For example, when at least one of H$_3$PO$_4$, KOH, H$_2$O$_2$, HF, and H$_2$SO$_4$ is used as the etching solution, the lateral regions of the substrate 105 may include at least one selected from the group consisting of phosphorus, fluorine, sulfur, and potassium in a small quantity.

The light emitting structure 110 is formed on the substrate 105 for generating the light. The light emitting structure 110 may include III-V group compound semiconductor materials, such as AlInGaN, GaAs, GaAsP, GaP, or GaN series materials. Preferably, the light emitting structure 110 may GaN series semiconductor materials.

The difference between the β-Ga$_2$O$_3$ and an AlInGaN, GaAs, GaAsP, GaP, or GaN-series compound semiconductor materials (especially, GaN-series semiconductor materials) in a lattice constant and in a thermal expansion coefficient is small. Therefore, the light emitting structure 110 can be formed with a good crystalline property on the substrate 105.

The light emitting structure 110 including the compound semiconductor material generates a light in a region from a visible ray to an infrared ray. The light emitted from the light emitting structure 110 can be extracted to the outside through the substrate 105.

The upper surface of the light emitting structure 110 may be formed with a roughness pattern in order to maximize the light extraction efficiency of the light emitting device 100.

For example, the light emitting structure 110 is formed by sequentially stacking the first conductive type semiconductor layer 112, the active layer 114, and the second conductive type semiconductor layer 116.

The first conductive type semiconductor layer 112 may include III-V group compound semiconductor materials, such as GaN, AN, AlGaN, InGaN, InN, InAlGaN, AlInN, AlGaAs, GaP, GaAs, GaAsP, and AlGaInP. The first conductive type semiconductor layer 112 may include an n type semiconductor layer, and then, the n type semiconductor layer may be doped with n type dopant such as Si, Ge, Sn, Se, and Te. The first conductive type semiconductor layer 112 may have a single-layered structure or a multi-layered structure, but is not limited thereto.

The active layer 114 may be formed on the first conductive type semiconductor layer 112. Electrons (or holes) injected through the first conductive type semiconductor layer 112 may be recombined with holes (or electrons) injected through the second conductive type semiconductor layer 116 at the active layer 114, so that the active layer 114 emits the light.

The active layer 114 may have at least one of a single quantum well structure, a multiple quantum well (MQW) structure, a quantum dot structure, or a quantum wire structure, but is not limited thereto. The active layer 114 may include III-V group compound semiconductor materials. In the case that the active layer 114 has the multiple quantum well (MQW), the active layer 114 may be formed of a plurality of well layers and a plurality of barrier layers. For example, the active layer 114 has a plurality of pairs of an InGaN well layer/GaN barrier layer or an InGaN well layer/AlGaN barrier layer.

A clad layer (not shown) doped with the n type or p type dopant can be formed on and/or under the active layer 114. The clad layer may include an AlGaN series material.

The second conductive type semiconductor layer 116 may be formed on the active layer 114. The second conductive type semiconductor layer 116 may include III-V group compound semiconductor materials, such as GaN, AN, AlGaN, InGaN, InN, InAlGaN, AlInN, AlGaAs, GaP, GaAs, GaAsP, and AlGaInP. The second conductive type semiconductor layer 116 may include a p type semiconductor layer, and then, the p type semiconductor layer may be doped with p type dopant such as Mg and Zn. The second conductive type semiconductor layer 116 may have a single-layered structure or a multi-layered structure, but is not limited thereto.

Meanwhile, the light emitting structure 110 may include an n type semiconductor layer (not shown) on the second conductive type semiconductor layer 116. Also, the first conductive type semiconductor layer 112 may include p type semiconductor layer, and the second conductive type semiconductor layer 116 may include n type semiconductor layer. Accordingly, the light emitting structure 110 may include at least one of an N-P junction structure, a P-N junction structure, an N-P-N junction structure, and a P-N-P junction structure.

A buffer layer (not shown) may be formed between the light emitting structure 110 and the substrate 105. In this case, the buffer layer may be formed for reducing a lattice constant difference between light emitting structure 110 and the substrate 105.

The buffer layer is formed of a separate layer. In this case, the buffer layer is grown before the light emitting structure 110 is grown. Selectively, the buffer layer is formed of GaN layer that is generated by replacing oxygen(O) with nitride (N) through nitriding of the substrate 105 including the $\beta$-$Ga_2O_3$.

The first conductive type semiconductor layer 112 is electrically connected to the substrate 105 including the $\beta$-$Ga_2O_3$, and the second conductive type semiconductor layer 116 is electrically connected to the electrode 120. Accordingly, the power can be applied to the first and second conductive type semiconductor layers 112 and 116 from the outside.

When n type or p type conductive dopants are doped into the substrate 105 including the $\beta$-$Ga_2O_3$, the substrate 105 including the $\beta$-$Ga_2O_3$ can have an electrical conductivity. Thus, the substrate 105 can act as an electrode.

The electrode 120 may be formed on the light emitting structure 110. For example, the electrode 120 may include at least one metal selected from the group consisting of Cu, Ag, Al, Ni, Ti, Cr, Pd, Au, or Sn. The electrode 120 may have a single-layered structure or a multi-layered structure, but is not limited thereto.

The electrode 120 may include a bonding pad region where the wire is bonded, and a wing region extended from the bonding pad region for spreading the current, but is not limited thereto.

Also, the electrode 120 may include a transparent conductive electrode layer (not shown) formed on the entire upper surface of the light emitting structure 110 in order to maximize the effect for spreading the current.

The transparent conductive electrode layer (not shown) may include a material having the transparency and the conductivity, for example, at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, Ni, Ag, or Au. The transparent conductive electrode layer (not shown) may have a single-layered structure or a multi-layered structure.

The passivation layer 130 may be formed at least the lateral surface region of the light emitting structure 110 and a part of the upper surface region of the light emitting structure 110, but is not limited thereto.

The passivation layer 130 may include a material that is not etched by the etching solution used at the electrode chemical etching, and that is transparent and electrically insulated. Specifically, the passivation layer 130 may include at least one of $SiO_2$, $SiO_x$, $SiO_xN_y$, $Si_3N_4$, $Al_2O_3$, or $TiO_x$, but is not limited thereto.

FIGS. 4 to 11 are cross-sectional views illustrating a method of manufacturing a light emitting device according to an embodiment. The contents stated above will be omitted or will describe briefly.

Figure 4:
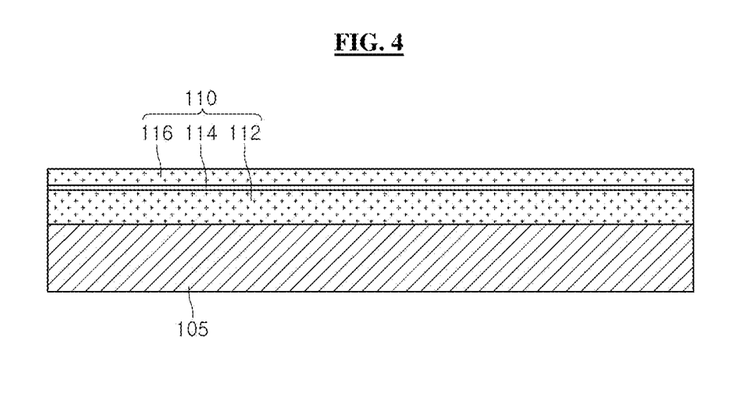
FIGS. 4 to 11 are cross-sectional views illustrating a method of manufacturing a light emitting device according to an embodiment.

Referring to FIG. 4, the light emitting structure 110 may be formed on the substrate 105 including the $\beta$-$Ga_2O_3$.

The light emitting structure 110 may be formed, for example, using a MOCVD (Metal Organic Chemical Vapor Deposition) method, a CVD (Chemical Vapor Deposition) method, a PECVD (Plasma-Enhanced Chemical Vapor Deposition) method, an MBE (Molecular Beam Epitaxy) method, an HVPE (Hydride Vapor Phase Epitaxy) method, etc., but is not limited thereto.

Figure 5:
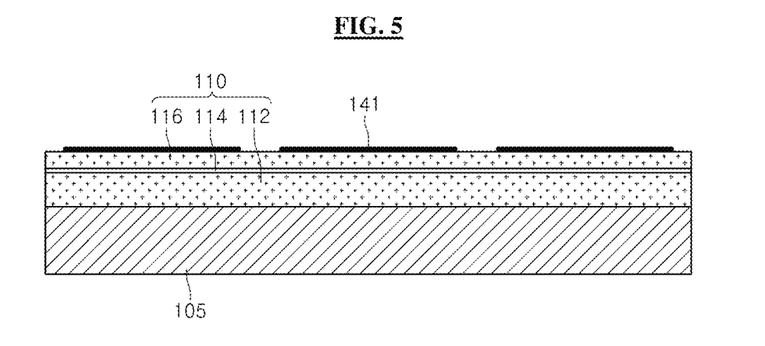

Referring to FIG. 5, a mask pattern 141 may be formed so that the chip boundary region defining the boundary between the plurality of light emitting device units can be exposed.

For example, the mask pattern 141 may include a photo resist, and may be formed by a photolithography process, but is not limited thereto.

Figure 6:
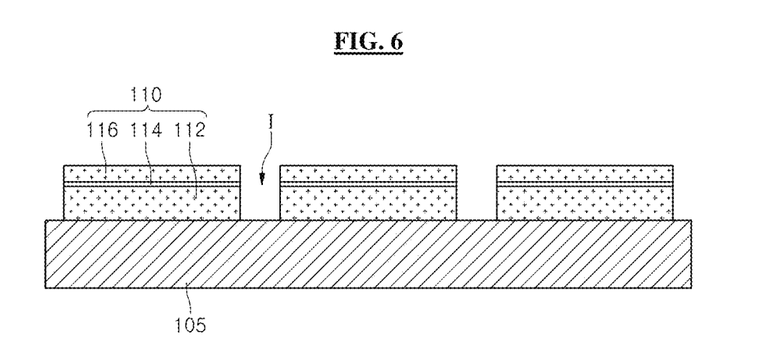

Referring to FIGS. 5 and 6, the light emitting structure 110 is subject to the isolation etching, such that the light emitting structure 110 is separated to correspond to a unit chip.

The isolation etching may be carried out by a dry etching such as an ICP/RIE (inductively coupled plasma/reactive ion etching), but is not limited thereto.

The mask pattern 141 may be removed after the isolation etching.

Figure 7:
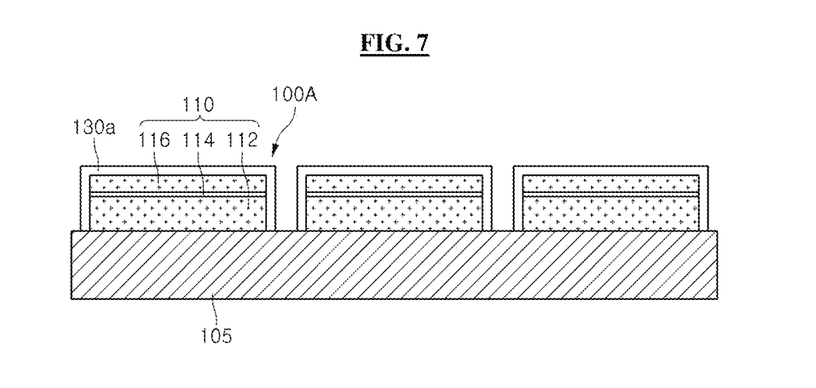

Referring to FIG. 7, a passivation layer 130a may be formed on each of the light emitting structures 110 divided corresponding to the unit light emitting device.

The passiviation layer 130a is formed for preventing the damage of the light emitting structures 110 during the electrochemical etching.

For this, the passivation layer 130a may be formed on the upper surface and the side surface of each of the light emitting structures 110 divided corresponding to the unit light emitting device. Preferably, the passivation layer 130a may surround the light emitting structures 110 so that the light emitting structures 110 are not exposed.

The passivation layer 130a may be formed using a deposition method, such as an E-beam deposition, sputtering, and a PECVD (Plasma-Enhanced Chemical Vapor Deposition) method, but is not limited thereto.

The passivation layer 130a may include a material that is not etched by the etching solution used at the electrodechemical etching, and that is transparent and electrically insulated. Specifically, the passivation layer 130a may include at least one of $SiO_2$, $SiO_x$, $SiO_xN_y$, $Si_3N_4$, $Al_2O_3$, or $TiO_x$, but is not limited thereto.

Figure 8:
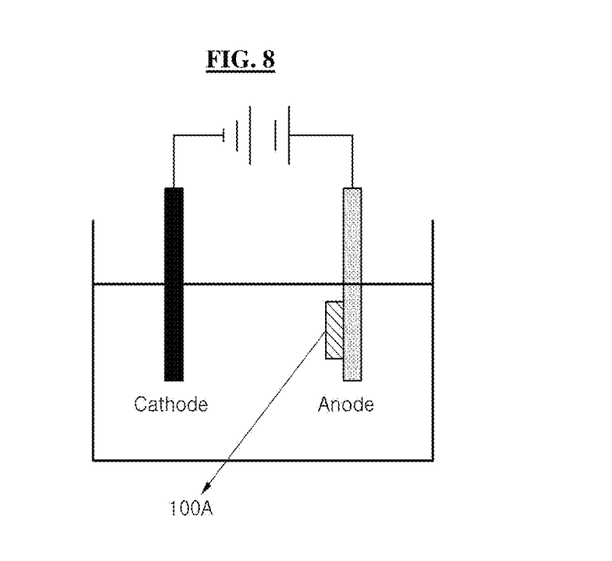

Referring to FIG. 8, the substrate 105 is divided corresponding to the individual light emitting device units by the electrochemical etching. That is, the wafer with the light emitting devices 100A of FIG. 7 is dipped into the etching solution and the bias voltage is applied to the etching solution in order to divide the substrate 105.

For example, the etching solution may include $H_3PO_4$, KOH, $H_2O_2$, HF, and $H_2SO_4$, but is not limited thereto.

Also, the bias voltage may be in a range from 1V to 100V. When the bias voltage is larger than 100V, the light emitting device 100 may be damaged.

However, the value of the bias voltage may be various according to a component of the etching solution, the thickness of the substrate 105, etc. Thus, the value of the bias voltage is not limited.

In addition, in order to maximize an effect of the electrochemical etching, unitasonic waves may be applied by an ultrasonic generator. Then, the etching solution can efficiently permeate into the chip boundary of the substrate 105.

Figure 9:
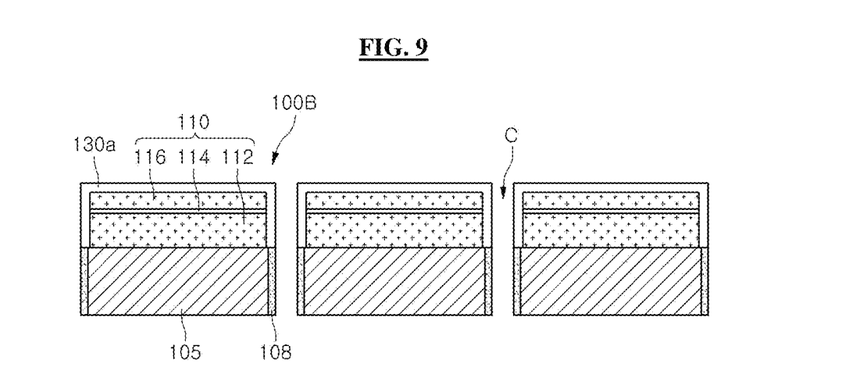

Referring to FIG. 9, the plurality of the light emitting devices 100B are mechanically separated by the chip separating process. That is, the substrate 105 is mechanically divided along the chip boundary region.

Also, the porous layer 108 may be formed at a lateral surface region of the substrate 105 of the light emitting devices 100B. The porous layer 108 may be formed when the chips are separated by the electrochemical etching. The porous layer 108 has a material identical to a material of the substrate 105 and a crystalline structure that is not denser than a crystalline structure of the substrate.

Figure 10:
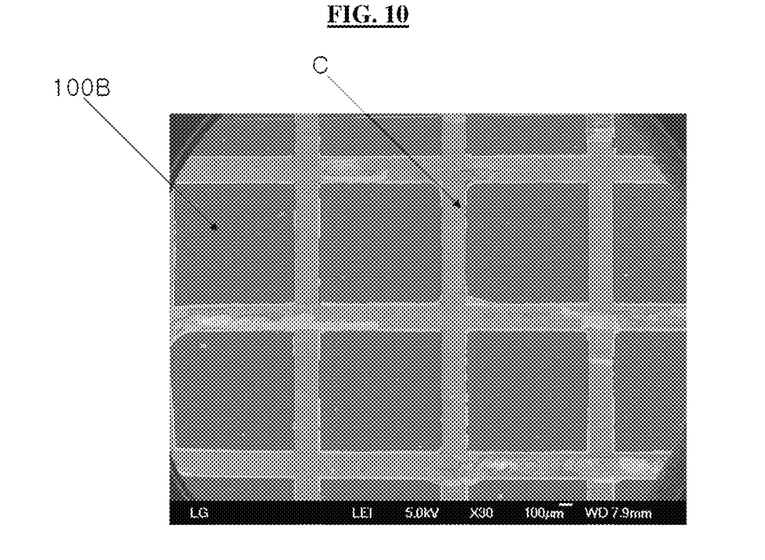

FIG. 10 illustrates a plurality of light emitting devices 100B actually manufactured in Example using the electrochemical etching as the isolation etching.

In Example, the $H_3PO_4$ was used as the etching solution, the bias voltage was about 100V or less, and the passivation 130a included $SiO_2$.

Referring to FIG. 10, it can be seen that the surface of the wafer is exposed at the chip boundary region C between the plurality of light emitting devices 100B. That is, it can be that the chips can be effectively separated by the electrochemical etching in the case using the substrate 105 including the β-$Ga_2O_3$.

Figure 11:
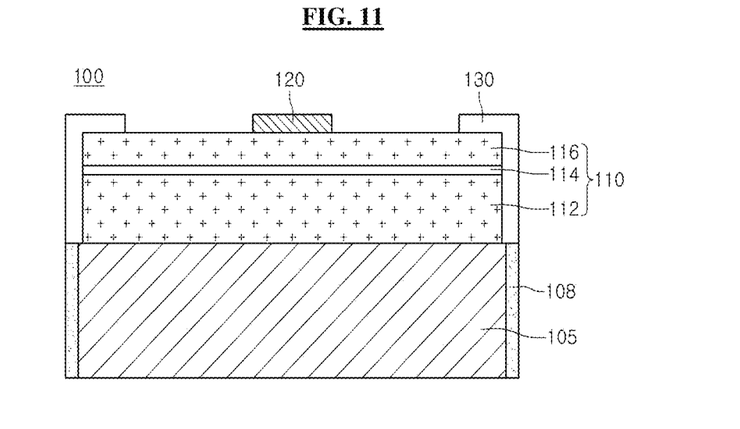

Referring to FIGS. 10 and 11, a part of the passivation layer 103a may be removed and the electrode 120 may be formed on the light emitting structure 110. Then, the light emitting device 100 according to the embodiment is provided.

The electrode 120 may be formed by a deposition manner or a plating manner, but is not limited thereto.

In addition, the upper surface of the light emitting structure 110 may be wet-etched in order to form the roughness pattern.

Figure 12:
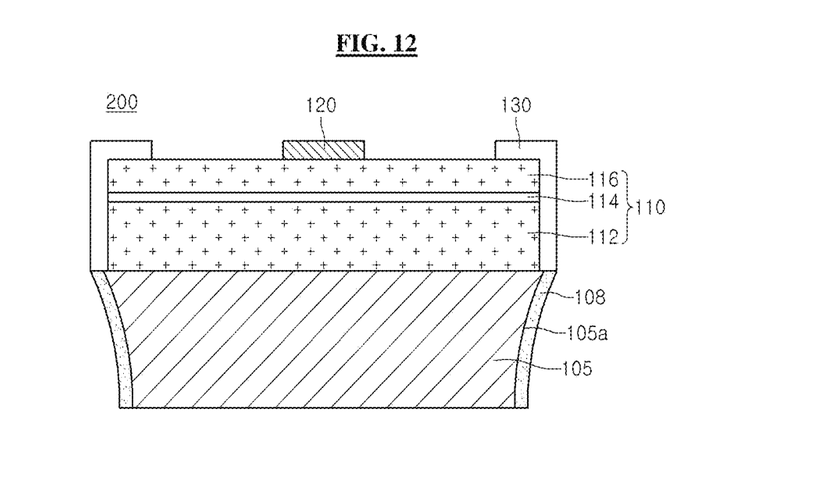
FIG. 12 is a cross-sectional view of a light emitting device according to another embodiment.

FIG. 12 is a cross-sectional view of a light emitting device 200 according to another embodiment.

Referring to FIG. 12, the light emitting device 200 includes a substrate 105 including β-$Ga_2O_3$, a light emitting structure 110 including a first conductive type semiconductor layer 112, an active layer 114, and a second conductive type semiconductor layer 116 for emitting a light on the substrate 105, an electrode 120 on the light emitting structure 110, a porous layer 108 at a lateral surface region of the substrate 105, and a passivation layer 130 formed at at least the lateral surface region of the light emitting structure 110.

In the embodiment, only a shape of the lateral surface region 105a is different from that the light emitting device 100 of FIG. 1.

That is, the lateral surface region 105a of the substrate 105 may have a curved surface. The curvature of the curved surface and the surface roughness may be various according to the etching solution used at the electrochemical etching and the value of the bias voltage.

Namely, since the electrochemical etching uses the wet etching, the isotropically-etched surface generated by the wet etching appears the lateral surface region 105a of the substrate 105. Thus, the lateral surface region 105a of the substrate 105 may have the curved surface.

Figure 13:
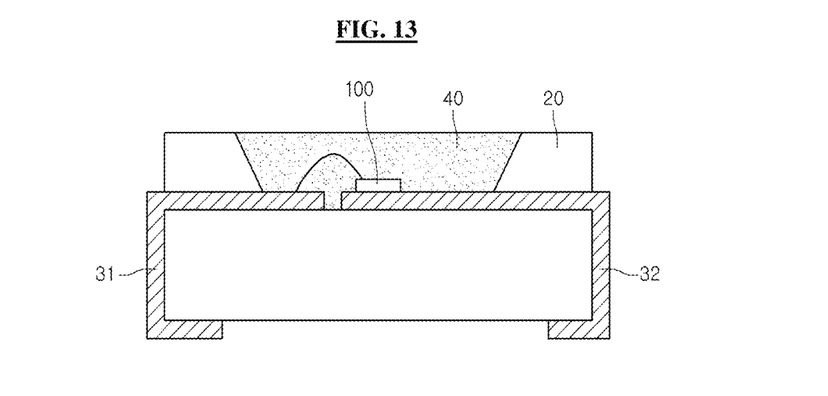
FIG. 13 is a cross-sectional view of a light emitting device package including a light emitting device according to an embodiment.

FIG. 13 is a cross-sectional view of a light emitting device package including the light emitting device 100 according to the embodiment.

Referring to FIG. 13, the light emitting device package according to the embodiment includes a package body 20, first and second lead electrodes 31 and 32 mounted on the package body 20, a light emitting device 100 according to the embodiments, which is mounted on the package body 20 and electrically connected to the first and second lead electrodes 31 and 32, and a molding member 40 enclosing the light emitting device 100.

The package body 20 may be formed including a silicon material, a synthetic resin material, or a metallic material, and may have an inclination surface around the light emitting device 100.

The first lead electrode 31 and the second lead electrode 32 are electrically separated, and supply an electric power to the light emitting device 100. Also, the first and second lead electrodes 31 and 32 may reflect light generated from the light emitting device 100 to thus increase light efficiency, and may emit heat generated from the light emitting device 100 to an outside.

The light emitting device 100 may be mounted on the package body 20 or on the first lead electrode 31 or the second lead electrode 32.

For example, the light emitting device 100 may be electrically connected to the first lead electrode 31 and the second lead electrode 32 by using the wire.

The molding member 40 may enclose and protect the light emitting device 100. Also, a fluorescent material may be included in the molding member 40 to change the wavelength of light emitted from the light emitting device 100.

The light emitting device package according to the current embodiment may mount at least one of the light emitting devices according to the foregoing embodiments, but the present invention is not limited thereto. The light emitting device package may include a plurality of light emitting device packages which are arrayed on a substrate. A plurality of optical members, such as a light guide panel, a prism sheet, a diffusion sheet, a fluorescent sheet, and the like may be arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 14:
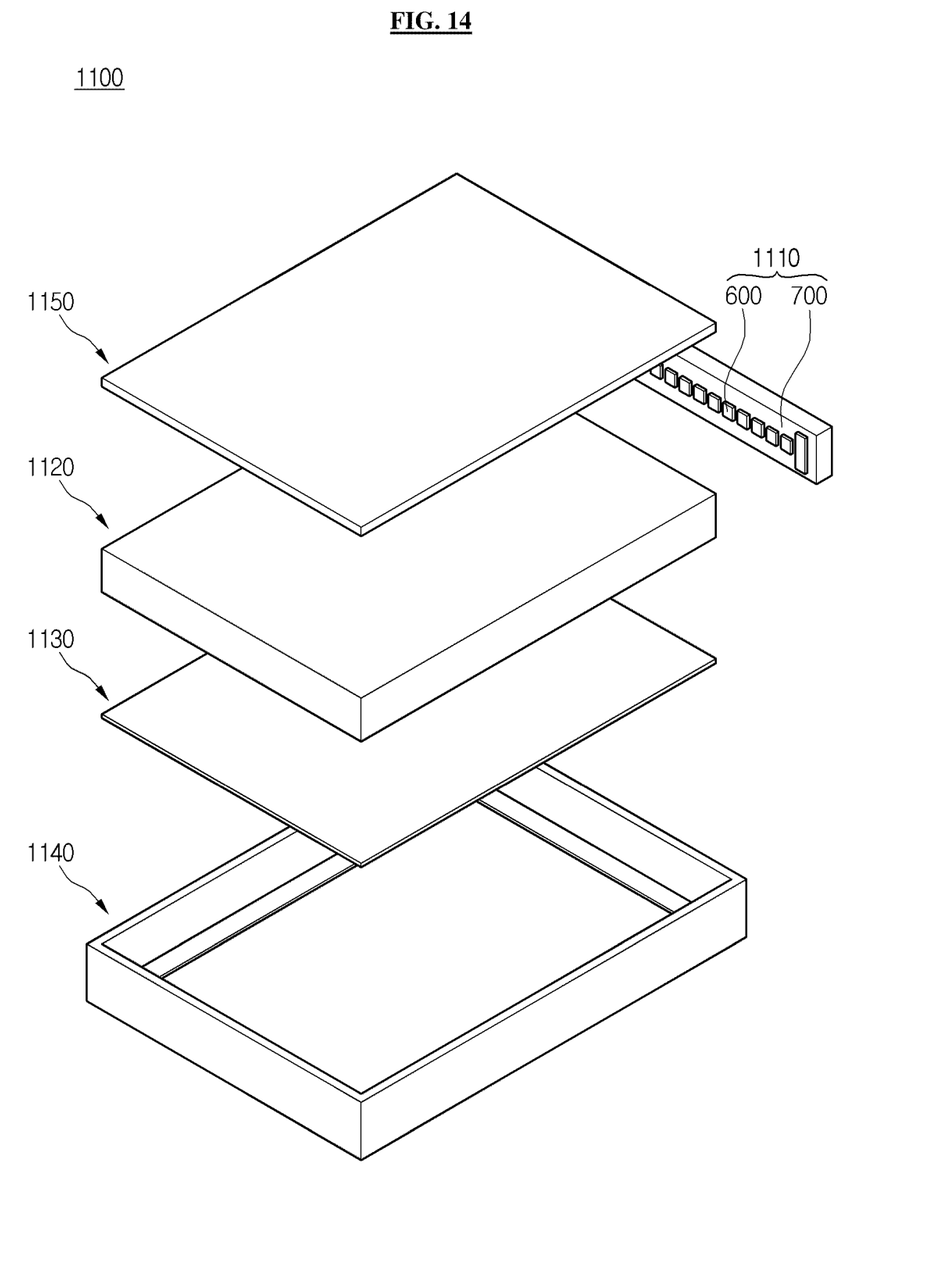
FIG. 14 is a disassembled perspective view of a backlight unit including a light emitting device or a light emitting device package according to an embodiment.

FIG. 14 is a disassembled perspective view of a backlight unit including a light emitting device or a light emitting device package according to an embodiment. The backlight unit 1100 of FIG. 14 is one example of lighting systems, and the present invention is not limited thereto.

Referring to FIG. 14, the backlight unit 1100 may include a bottom cover 1140, a light guide member 1120 disposed in the bottom cover 1140, and a light emitting module 1110 disposed on at least one side surface of the light guide member 1120 or under the light guide member 1120. Also, a reflective sheet 1130 may be disposed under the light guide member 1120.

The bottom cover 1140 may be formed in a box shape a top surface of which is opened such that the light guide member 1120, the light emitting module 1110 and the reflective sheet 1130 can be received. The bottom cover 1140 may be formed of a metal or resin material, but the invention is not limited thereto.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the current embodiment, it is exemplarily shown that the light emitting device packages 600 are mounted on the substrate 700, but the light emitting devices according to the embodiments may be mounted directly on the substrate 700.

As shown in FIG. 14, the light emitting module 1110 may be disposed on at least one of inner side surfaces of the bottom cover 1140, and thus may provide light to at least one of the side surfaces of the light guide member 1120.

It is also to be understood that the light emitting module 1110 may be disposed under the light guide member 1120 inside the bottom cover 1140 to provide light toward a bottom surface of the light guide member 1120. However, since such a constitution may be modified according to the design of the backlight unit 1100, the invention is not limited thereto.

The light guide member 1120 may be disposed inside the bottom cover 1140. The light guide member 1120 may convert the light provided from the light emitting module to a planar light source and guide the converted plane light source to a display panel (not shown).

The light guide member 1120 may be, for example, a light guide panel (LGP). The LGP may be formed of, for example, one of acryl-series resin such as polymethyl metaacrylate (PMMA), polyethylene terephthlate (PET), poly carbonate (PC), COC, and polyethylene naphthalate resin.

An optical sheet 1150 may be disposed on the light guide member 1120.

The optical sheet 1150 may include, for example, at least one of a diffusion sheet, a light-condensing sheet, a brightness enhancement sheet and a fluorescent sheet. For example, the optical sheet 1150 may be configured by the diffusion sheet, the light-condensing sheet, the brightness enhancement sheet and the fluorescent sheet stacked. In this case, the diffusion sheet 1150 diffuses the light emitted from the light emitting module 1110 uniformly, and the diffused light may be condensed on the display panel (not shown) by the light-condensing sheet. At this time, the light emitted from the light-condensing sheet is a randomly polarized light, and the brightness enhancement sheet may increase the polarization of the light emitted from the light-condensing sheet. The light-condensing sheet may be, for example, a horizontal and/or vertical prism sheet. Also, the brightness enhancement sheet may be, for example, a dual brightness enhancement film. Also, the fluorescent sheet may be a transparent plate or film including a fluorescent material.

The reflective sheet 1130 may be disposed under the light guide member 1120. The reflective sheet 1130 may reflect light emitted from the bottom surface of the light guide member 1120 toward a light emitting surface of the light guide member 1120.

The reflective sheet 1130 may be formed of resin material having good reflectivity, for example, PET, PC, PVC resins, or the like, but the invention is not limited thereto.

Figure 15:
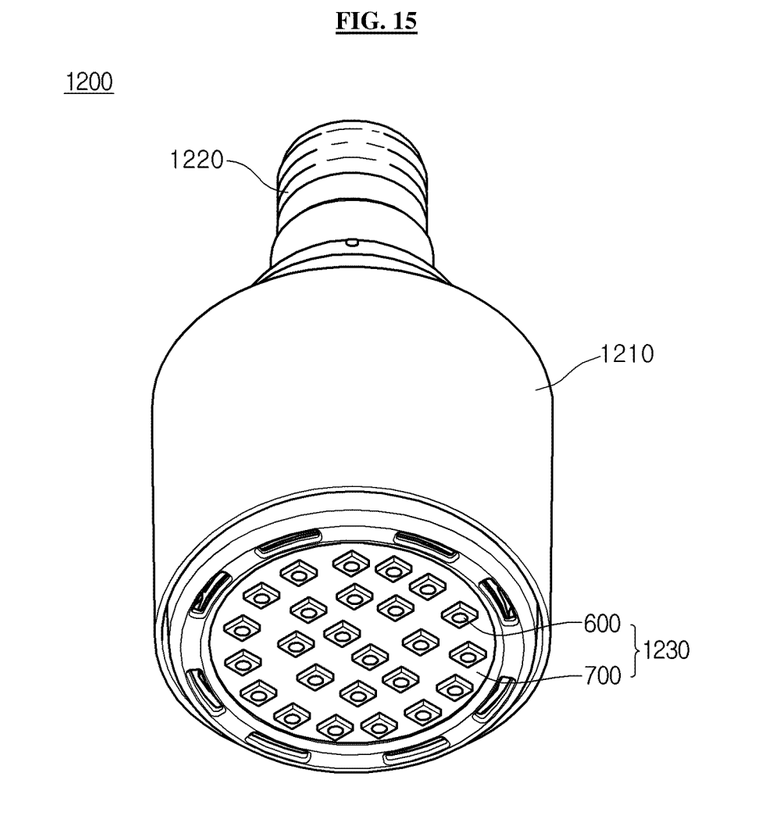
FIG. 15 is a perspective view of a lighting unit including a light emitting device or a light emitting device package according to an embodiment.

FIG. 15 is a perspective view of a lighting unit including a light emitting device or a light emitting device package according to an embodiment. The lighting unit 1200 of FIG. 15 is an example of lighting systems and the invention is not limited thereto.

Referring to FIG. 15, the lighting unit 1200 may include a case body 1210, a light emitting module 1230 installed in the case body 1210, and a connection terminal installed in the case body 1210 to be supplied with an electric power from an external power source.

The case body 1210 may be preferably formed of a material having good heat shielding characteristic, for example, a metal material or a resin material.

The light emitting module 1230 may include a substrate 700, and a light emitting device package 600 mounted on the substrate 700. In the light emitting module 1230 according to the current embodiment, it is exemplarily shown that the light emitting device packages 600 are mounted on the substrate 700, but the light emitting devices according to the embodiments may be mounted directly on the substrate 700.

The substrate 700 may be an insulator substrate on which a circuit pattern is printed, and may include, for example, a general printed circuit board (PCB), a metal core PCB, a flexible PCB, a ceramic PCB, etc.

Also, the substrate 700 may be formed of a material to efficiently reflect light, and a surface thereof may be formed in a color capable of efficiently reflecting light, for example, white color, silver color, or the like.

At least one light emitting device package 600 may be mounted on the substrate 700. Each of the light emitting device packages 600 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 1230 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply an electric power to the light emitting module 1230. As shown in FIG. 15, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a light-condensing sheet, a brightness enhancement sheet and a fluorescent sheet on a traveling path of light to obtain a desired optical effect.

As described above, since the lighting system according to this embodiment includes the light emitting device or light emitting device package having the enhanced light emitting efficiently and the enhanced reliability, the lighting system can show superior characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate including $\beta$-$Ga_2O_3$;
   a light emitting structure on the substrate, the light emitting structure including a first conductive type semiconductor layer, an active layer, and a second conductive type semiconductor layer;
   an electrode on the light emitting structure;
   a porous layer at a lateral surface region of the substrate; and
   a passivation layer in at least the lateral surface region of the light emitting structure,
   wherein the porous layer is made of $\beta$-$Ga_2O_3$ and a crystalline structure of the porous layer is less dense than that of the $\beta$-$Ga_2O_3$ in the substrate,
   wherein a top surface of the porous layer is physically connected to a bottom surface of the passivation layer.

2. The light emitting device of claim 1, wherein a lateral surface of the substrate is curved, and
   wherein a lateral width of a top portion of the substrate is longer than a lateral width of a bottom portion of the substrate,
   wherein the light emitting structure is directly disposed on a top portion of the substrate.

3. The light emitting device of claim 1, wherein the substrate has a thickness in a range of about 1 μm to about 500 μm.

4. The light emitting device of claim 1, wherein the porous layer includes at least one selected from the group consisting of phosphorus, fluorine, and potassium, wherein the top surface of the porous layer is directly disposed on the bottom surface of the passivation layer.

5. The light emitting device of claim 1, wherein the substrate includes conductive dopants, wherein the top surface of the porous layer is substantially flush with a top portion of the substrate.

6. The light emitting device of claim 1, wherein the passivation layer includes at least one selected from the group consisting of $SiO_2$, $SiO_x$, and $TiO_x$.

7. The light emitting device of claim 1, further comprising a buffer layer interposed between the light emitting structure and the substrate.

8. The light emitting device of claim 7, wherein the buffer layer includes GaN.

* * * * *